(12) United States Patent
Yu

(10) Patent No.: US 11,522,622 B1
(45) Date of Patent: Dec. 6, 2022

(54) SIGNAL RECEIVER AND DETECTION SYSTEM

(71) Applicant: Ping Yu, Yichun (CN)

(72) Inventor: Ping Yu, Yichun (CN)

( * ) Notice: Subject to any disclaimer, the term of this patent is extended or adjusted under 35 U.S.C. 154(b) by 0 days.

(21) Appl. No.: 17/687,676

(22) Filed: Mar. 6, 2022

(30) Foreign Application Priority Data

Jan. 26, 2022 (CN) .......................... 202220221731.9

(51) Int. Cl.
| | |
|---|---|
| *G01V 15/00* | (2006.01) |
| *G01V 3/08* | (2006.01) |
| *H04B 17/00* | (2015.01) |
| *F16L 55/48* | (2006.01) |
| *H04B 17/23* | (2015.01) |
| *H05K 5/02* | (2006.01) |
| *H02G 3/08* | (2006.01) |
| *H04B 17/27* | (2015.01) |
| *G08B 7/06* | (2006.01) |
| *H05K 5/00* | (2006.01) |
| *F16L 101/30* | (2006.01) |
| *H04N 7/18* | (2006.01) |
| *G01D 11/30* | (2006.01) |
| *H04N 5/225* | (2006.01) |

(52) U.S. Cl.
CPC .............. *H04B 17/23* (2015.01); *G08B 7/06* (2013.01); *H02G 3/081* (2013.01); *H04B 17/27* (2015.01); *H05K 5/0017* (2013.01); *H05K 5/023* (2013.01); *F16L 55/48* (2013.01); *F16L 2101/30* (2013.01); *G01D 11/30* (2013.01); *G01V 15/00* (2013.01); *H04N 5/2253* (2013.01); *H04N 7/185* (2013.01)

(58) Field of Classification Search
CPC ...... H02G 3/081; H05K 5/0017; H05K 5/023; F16L 55/48; G01V 15/00; G01D 11/30; H04N 5/2253; H04N 7/185; H04B 117/23; H04B 117/27
See application file for complete search history.

(56) References Cited

U.S. PATENT DOCUMENTS

| | | | | |
|---|---|---|---|---|
| 5,430,379 A | * | 7/1995 | Parkinson | G01V 3/15 324/67 |
| 6,545,704 B1 | * | 4/2003 | Olsson | G01M 3/005 348/E7.087 |
| 7,431,619 B2 | * | 10/2008 | Boehnlein | G02B 23/2476 439/882 |
| 7,723,990 B2 | * | 5/2010 | Mulcahey | G01V 3/06 324/67 |
| 10,009,582 B2 | * | 6/2018 | Olsson | G01D 11/30 |
| 2022/0128424 A1 | * | 4/2022 | Krohlow | G01N 21/954 |

FOREIGN PATENT DOCUMENTS

| | | | |
|---|---|---|---|
| CN | 203870271 U | * | 10/2014 |
| CN | 211180258 U | * | 8/2020 |
| CN | 212410886 U | * | 1/2021 |
| CN | 212808668 U | * | 3/2021 |

* cited by examiner

*Primary Examiner* — Tan Le

(57) ABSTRACT

The present disclosure relates to a signal receiver and a detection system. The signal receiver includes a housing and a handle. The housing includes a body and a protrusion. The body includes a first face and a second face disposed opposite each other. The protrusion is connected to the body and protrudes relative to the first face along a direction away from the second face. The handle is arranged on the first face.

15 Claims, 13 Drawing Sheets

SIGNAL RECEIVER AND DETECTION SYSTEM

CROSS REFERENCE

The present application claims foreign priority of Chinese Patent Application No. 202220221731.9, filed on Jan. 26, 2022, in the China National Intellectual Property Administration, the entire contents of which are hereby incorporated by reference in its entirety.

TECHNICAL FIELD

The present disclosure relates to the field of detection technologies, and in particular to a signal receiver and a detection system.

BACKGROUND

Pipeline detection systems are often used in regions where personnel cannot or do not want to detect directly, such as water supply pipelines, air conditioning pipelines, cable pipelines, pipeline vacuum systems, lead industrial pipelines, underground pipelines of buildings, underground caves in the field, underwater riverbeds, etc. In these regions with small space or harsh environment, operators often cannot enter the scene to directly survey, need to obtain image or video signals inside the pipelines through a detector with a camera, and transmit the signals.

To determine the position of the detector in an region such as a pipeline, a signal receiver may be applied to receive a positioning signal from the detector and determine the position of the detector in the region based on the strength of the received positioning signal. It is a challenge to design the signal receiver in a better way.

SUMMARY OF THE DISCLOSURE

To solve the above technical problem, an aspect of the present disclosure is to provide a signal receiver. The signal receiver includes a housing and a handle. The housing includes a body and a protrusion. The body includes a first face and a second face disposed opposite each other. The protrusion is connected to the body and protrudes relative to the first face along a direction away from the second face. The handle is arranged on the first face.

Another aspect of the present disclosure is to provide a detection system. The detection system includes a detector, a signal receiver, a detection terminal box, and a cable. The detector is configured to obtain detection data and emit a wireless signal. The signal receiver is configured to receive the wireless signal for positioning the detector. The detection terminal box is configured to process the detection data. The cable is configured to transmit the detection data. An end of the cable is connected to the detector, and the other end of the cable is connected to the detection terminal box.

The beneficial effect of the present disclosure is that, in contrast to the prior art, the handle and the protrusion that protrudes relative to the first face along a direction away from the second face are provided. The arrangement of the handle and the protrusion prevents damage to the components arranged on the first face of the body, for example, when the signal receiver is dropped. In addition, the arrangement of the handle and the protrusion can also facilitate observation of the information displayed on the protrusion when the user holds the handle.

BRIEF DESCRIPTION OF THE DRAWINGS

To illustrate the technical solutions more clearly in the embodiments of the present disclosure, the following will be briefly described in the description of the embodiments required to use the attached drawings. It is obvious that the following description of the attached drawings are only some of the embodiments of the present disclosure, and those skilled in the art, without creative work, can also obtain other attached drawings based on these drawings.

DETAILED DESCRIPTION

Figure 1:
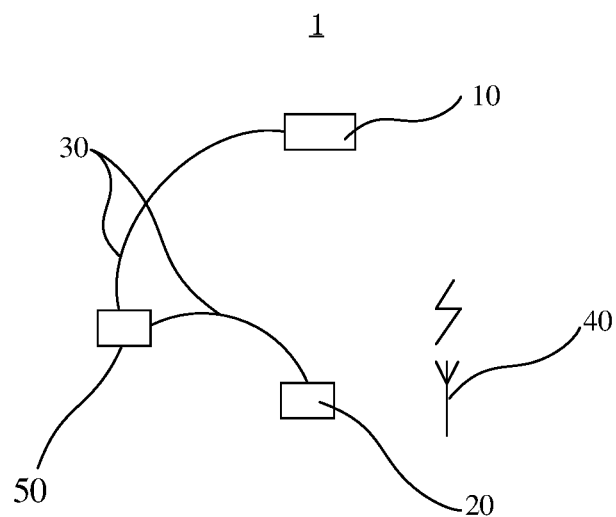
FIG. 1 is a schematic view of a detection system according to an embodiment of the present disclosure.

The technical solutions in the embodiments of the present disclosure will be clearly and completely described below in conjunction with the accompanying drawings in the embodiments of the present disclosure. Obviously, the described embodiments are only a part of the embodiments of the present disclosure, and not all of them. Based on the embodiments in the present disclosure, all other embodiments obtained by those skilled in the art without making creative labor fall within the scope of the present disclosure.

In the description of the present disclosure, it is to be understood that the terms "center", "longitudinal", "transverse", "length", "width", "thickness", "up", "down", "front", "back", "left", "right", "vertical", "horizontal", "top", "bottom", "inside", "outside", "clockwise", "counterclockwise", etc. indicate an orientation or positional relationship based on the orientation or positional relationship shown in the accompanying drawings and are intended only to facilitate and simplify the description of the present disclosure, not to indicate or imply that the device or element referred to must have a particular orientation, be constructed and operate in a particular orientation, and therefore cannot be construed as a limitation of the present disclosure.

Furthermore, the terms "first" and "second" are used for descriptive purposes only and are not to be construed as indicating or implying relative importance or implicitly specifying the number of technical features indicated. Thus, the features qualified with "first" and "second" may explicitly or implicitly include one or more such features. In the description of the present disclosure, "plurality" means two or more, unless otherwise expressly and specifically limited.

In the present disclosure, unless otherwise expressly specified and limited, the terms "mounted", "connected", "coupled", "fixed", etc. should be understood in a broad sense, e.g. It can be a fixed connection, a removable connection, or a one-piece connection; it can be a mechanical connection or an electrical connection; it can be a direct connection or an indirect connection through an intermediate medium, and it can be a connection within two components. To those skilled in the art, the specific meaning of the above terms in the present disclosure can be understood on a case-by-case basis.

In the present disclosure, unless otherwise expressly specified and limited, the first feature "on" or "under" the second feature may include direct contact between the first and second features or may include contact between the first and second features not directly, but through an additional feature between them. Also, the first feature being "on", "above" and "on top of" the second feature includes the first feature being directly above and diagonally above the second feature, or simply indicating that the first feature is horizontally higher above the second feature. The first feature being "under", "below" and "on bottom of" the second feature includes the first feature being directly below and diagonally below the second feature, or simply indicating that the horizontal height of the first feature is lower than the horizontal height of the second feature.

The present disclosure provides a detection system that can be used to detect regions that personnel are unable or unwilling to detect directly, such as natural human or animal cavities, tunnels, urban underground pipelines, etc. Application regions for the detection system may include underwater, pipeline, industrial, mechanical, chemical, etc. Optionally, but not restrictively, these regions may be water supply pipelines, air conditioning pipelines, cable pipelines, pipeline vacuum systems, lead industrial pipelines, underground pipelines of buildings, underground caves in the field, underwater riverbeds, etc., without limitation in the present disclosure. The following is a further detailed description of the present disclosure by specific implementation with the accompanying drawings, taking a pipe detector as an example.

Referring to FIG. 1, FIG. 1 is a schematic view of a detection system 1 according to an embodiment of the present disclosure. As shown in FIG. 1, the detection system 1 includes a detector 10 and a detection terminal box 20 connected by a cable 30. The detector 10 is configured to detect conditions inside a pipe, for example by means of a camera, to obtain detection data. In some embodiments, the detector 10 is also configured to have a positioning function. For example, when the detector 10 finds a fault position or a blockage position within the pipe, the detector 10 can position the fault position or the blockage position. The detection terminal box 20 may be arranged with a display configured to display data detected by the detector 10. In some embodiments, the detection terminal box 20 is configured to display an image taken by the detector 10 through the display. The cable 30 is configured to connect the detector 10 and the detection terminal box 20 together to transmit the detection data to the detection terminal box 20. In some embodiments, the detection terminal box 20 may also be configured to provide power to the detector 10 through the cable 30.

As shown in FIG. 1, the detection system 1 further includes a signal receiver 40 to receive a signal emitted by the detector 10 and thereby determine the position of the detector 10. The signal receiver 40 may receive signals by means of, for example, Wi-Fi, AM, FM, etc. In some embodiments, the signal receiver 40 operates using a signal with a central operating frequency of 512 Hz, which is not limited by the present disclosure.

As shown in FIG. 1, the detection system 1 further includes a cable winding frame 50. The cable 30 described above may be wound on the cable winding frame 50 to rewind the cable 30 as needed for the operation of the detector 10, thereby controlling the length of the cable 30 released.

Figure 2:
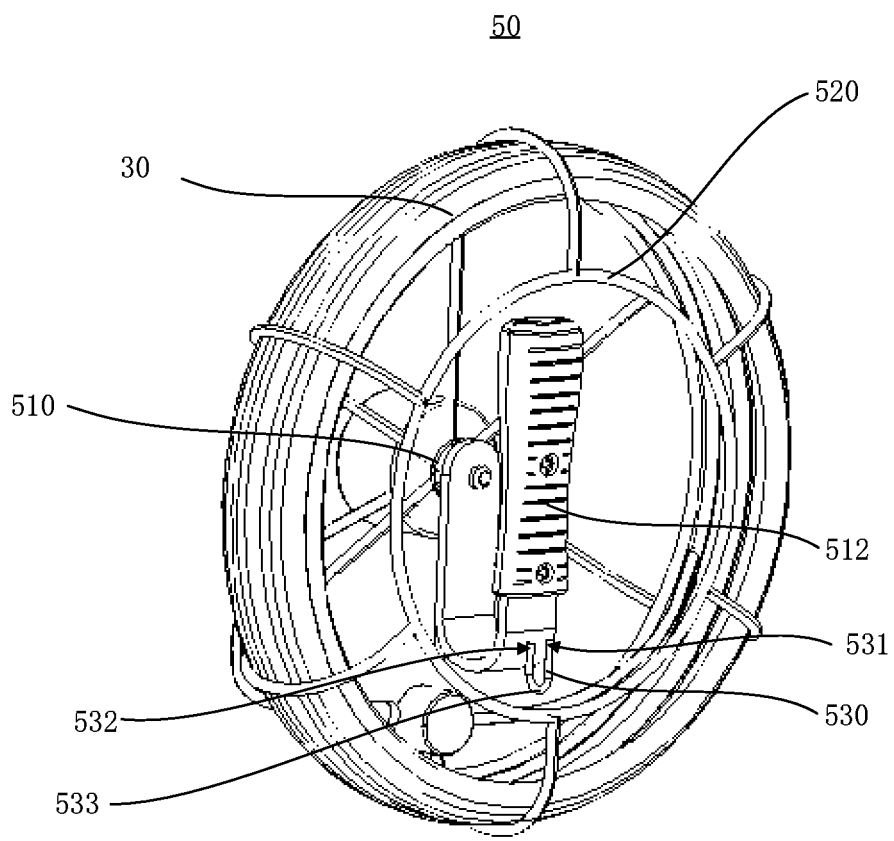
FIG. 2 is a perspective view of a cable winding frame according to an embodiment of the present disclosure.
Figure 3:
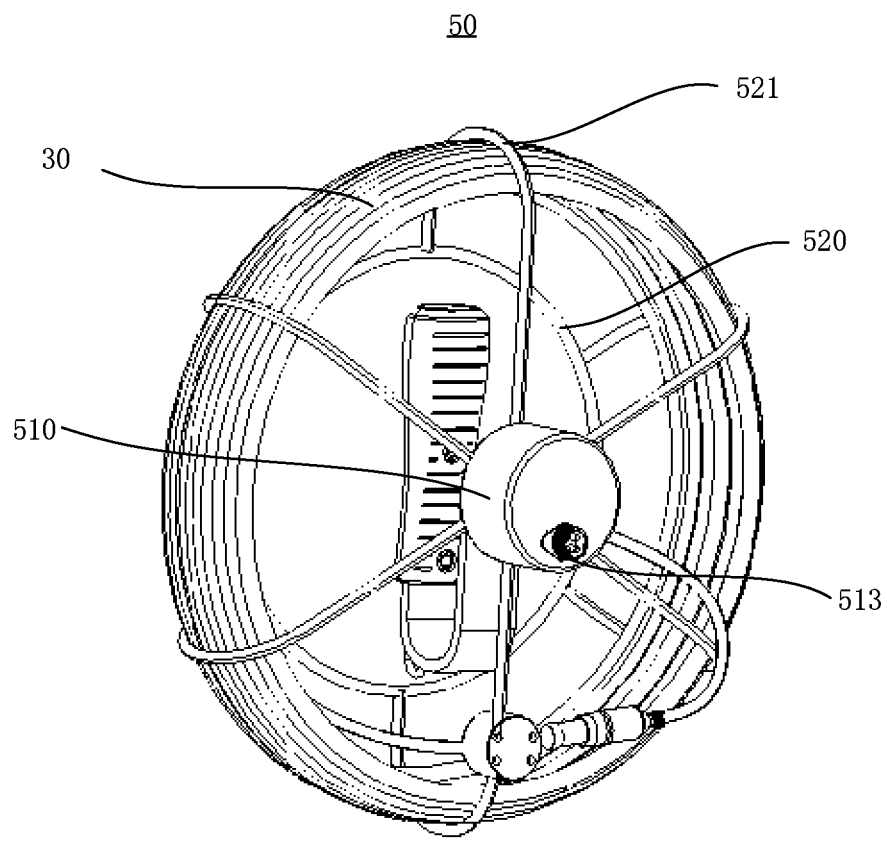
FIG. 3 is another perspective view of the cable winding frame in FIG. 2.

Referring to FIGS. 2 and 3, FIGS. 2 and 3 show perspective views of the cable winding frame 50 with the cable 30 wound thereon, respectively.

In some embodiments, the cable 30 is a rigid cable 30 with a certain degree of stiffness. In some embodiments, the rigid cable 30 may be a semi-rigid cable 30. The rigid cable 30 may withstand a certain degree of bending moment without bending deformation. Since the rigid cable 30 is not easily deformed by bending, the detector 10 connected to the cable 30 may be advanced in the pipe by conveying the rigid cable 30 forward. Based on the retracted length of the cable 30, it is also possible to assist in determining the depth of the detector 10 into the pipe. However, since the pipe may be irregular, the length of the rigid cable 30 can only determine the position of a fault or blockage inside a straight pipe, but not inside an irregular pipe. The signal receiver 40 described above may be enabled to determine the position of the detector 10 within the pipe. Knowing the position of the detector 10, the position of the fault or blockage inside the irregular pipe can be determined.

In some embodiments, the cable 30 is a metal stranded wire with a protective jacket. In some embodiments, the cable 30 is an optical fiber with a rigid protective jacket. In some embodiments, the cable 30 is a glass fiber electrical cable. In some embodiments, the cable 30 includes both a metal stranded wire and an optical fiber covered with a protective jacket. That is, the stiffness of the rigid cable 30 may be given by the conductor and/or protective jacket of the cable 30, without limitation in the present disclosure. In some embodiments, the length of the cable 30 is 10 m, 20 m, 30 m, 40 m, 50 m or longer, without limitation in the present disclosure.

Referring further to FIGS. 2 and 3, the cable winding frame 50 includes a main support frame 510 and a rotating bracket 520. The rotating bracket 520 is rotatably arranged on the main support frame 510. The cable 30 is wound on the rotating bracket 520 to rewind the cable 30 by rotating the rotating bracket 520.

In some embodiments, a rotating shaft of the rotating bracket 520 is rotatably disposed on the main support frame 510. The rotating bracket 520 further includes a cable carrier 521 connected to the rotating shaft. The cable 30 is wound around the inside of the cable carrier 521, such that the cable carrier 521 prevents the cable 30 from loosening due to elastic expansion. By rotating the rotating bracket 520, the cable 30 may be retracted.

In some embodiments, the main support frame 510 of the cable winding frame 50 includes a carrying handle 512 and a socket 513. The carrying handle 512 is fixedly connected to the main support frame 510 of the cable winding frame 50 on a side of the rotating bracket 520. A user may grasp the carrying handle 512 to move the cable winding frame 50. The socket 513 may be arranged on a side of the main support frame 510 opposite to the carrying handle 512. An end of the cable 30 may be electrically connected to the socket 513, and the detection terminal box 20 may be connected to the cable 30 through the socket 513. The socket 513 provides a relatively secure connection between the cable 30 and the detection terminal box 20. In some embodiments, the socket 513 is a flexible socket. The other end of the cable 30 may be moved away from or near the cable winding frame 50 as the cable 30 is retracted.

Referring to FIG. 2, the main support frame 510 of the winding frame 50 further includes a guide hook 530. The guide hook 530 includes a root portion 531, a free end 532, and a curved portion 533 between the root portion 531 and the free end 532. The guide hook 530 is connected to the main support frame 510 at the root portion 531. In some embodiments, the guide hook 530 is connected to a side of the main support frame 510 with the carrying handle 512 at the root portion 531. The cable 30 may be extended through the guide hook 530 when the cable 30 is being retracted. The cable 30 rests under its own tension against the inside of the curved portion 533 of the guide hook 530.

Specifically, when the user grasps the carrying handle 512, the orientation of the carrying handle 512 and the main support frame 510 and guide hook 530 connected to the carrying handle 512 are relatively stable, such as along the direction of gravity, under the gravity of the winding frame 50 and the cable 30. Extending the cable 30 through the guide hook 530 ensures that the cable 30 is led from the cable winding frame 50 in a relatively stable position, thereby improving the operability of the cable winding frame 50. In this case, the user may simply rotate the rotating bracket 520 of the cable winding frame 50 to allow the cable 30 to be stably retracted through the guide hook 530.

Figure 4:
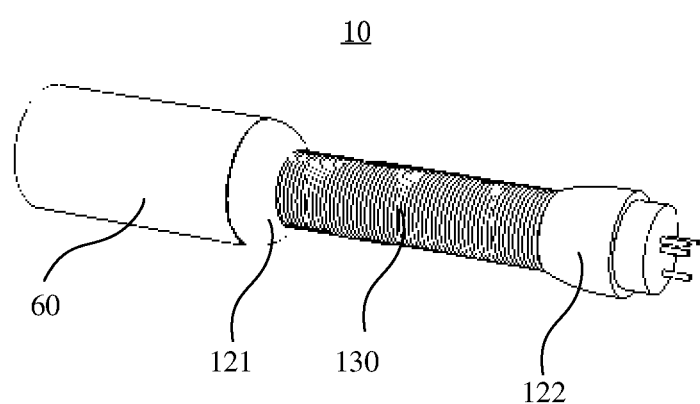
FIG. 4 is a schematic view of a detector according to an embodiment of the present disclosure.
Figure 5:
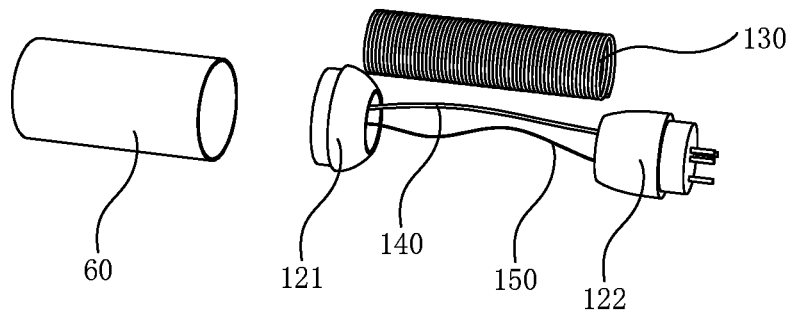
FIG. 5 is an exploded schematic view of the detector in FIG. 4.

Referring to FIGS. 4 and 5, FIG. 4 is a schematic view of a detector 10 assembled according to an embodiment of the present disclosure, and FIG. 5 is an exploded schematic view of the detector 10 in FIG. 4.

As shown in FIG. 4 and FIG. 5, in the embodiment, the detector 10 includes a probe 60, a first connector 121, a flexible connecting member 130, and a second connector 122 connected in sequence. Specifically, the first connector 121 is removably connected to the probe 60, for example, by threaded connection, snap connection, etc. The flexible connecting member 130 is fixedly attached between the first connector 121 and the second connector 122. The second connector 122 is configured to be connected to an external device. In some embodiments, the second connector 122 is configured to connect to the cable 30.

In the embodiments, the probe 60 is configured to detect conditions inside the pipe, for example, by means of a camera, to obtain detection data. The probe 60 may be a 23 mm-diameter stainless steel probe. The flexible connecting member 130 can be bent and deformed, thereby allowing the probe 60 to change the angle of detection. In addition to the connection role, the first connector 121 and the second connector 122 are further configured to fix two ends of the flexible connecting member 130.

Referring to FIG. 5, the detector 10 further includes a transmission line 140 and a flexible protective member 150. Specifically, an end of the transmission line 140 is threaded through the first connector 121 and connected to the probe 60, and the other end of the transmission line 140 is connected to the second connector 122. As described above, the second connector 122 is connected to the cable 30. In this way, the transmission line 140 can send the detection data from the probe 60 through the cable 30 to the detection terminal box 20.

Specifically, an end of the flexible protective member 150 is connected to the first connector 121, and the other end of the flexible protective member 150 is connected to the second connector 122. The flexible protective member 150 may be configured to protect the transmission line 140, which will be described below.

Figure 6:
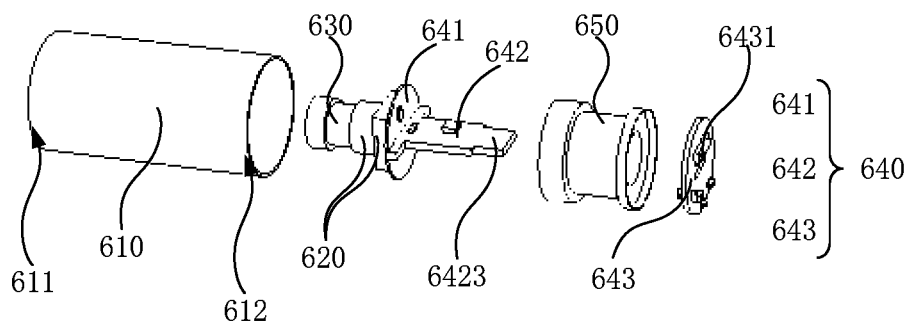
FIG. 6 is an exploded schematic view of a probe according to an embodiment of the present disclosure.

Referring to FIG. 6, FIG. 6 is an exploded schematic view of a probe 60 according to an embodiment of the present disclosure. As shown in FIG. 6, the probe 60 includes an outer housing 610, a base 620, a camera 630, a circuit module 640, and a signal transmitter 650. The outer housing 610 has a first end 611 and a second end 612 disposed opposite each other, and the second end 612 of the outer housing 610 is connected to the first connector 121. In some embodiments, the second end 612 of the outer housing 610 is arranged with a thread or snap-fit member to connect to a corresponding thread or snap-fit member of the first connector. The base 620 is arranged within the outer housing 610. The camera 630 is arranged within the outer housing 610 and is connected to a side of the base 620. The camera 630 is oriented toward the first end 611 of the outer housing 610 to obtain detection data by photographing. The circuit module 640 is at least partially arranged within the outer housing 610 and is connected to the other side of the base 620 away from the camera 630 for controlling the camera 630 and/or the signal transmitter 650, etc.

Figure 7:
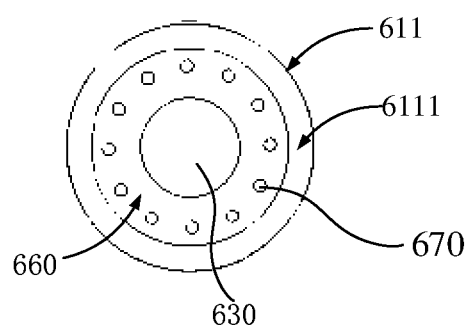
FIG. 7 is a side view of a housing according to an embodiment of the present disclosure.

Referring to FIG. 7, FIG. 7 is a side view of the outer housing 610 according to an embodiment of the present disclosure as viewed from the first end 611. As shown in FIG. 7, the outer housing 610 may be a tubular or columnar, particularly a cylindrical structure for defining a cavity to accommodate parts such as the base 620, the camera 630, the circuit module 640, and the signal transmitter 650 at least partially. The outer housing 610 may be made of metal or metal alloy to act as a seal and withstand external impacts, etc., thereby protecting the fragile parts housed within it. In some embodiments, the outer housing 610 may be made of hard plastic, etc., which is not limited in the present disclosure.

In some embodiments, the first end 611 of the outer housing 610 is arranged with a mounting flange 6111 radially inwardly extending, for mounting structures such as a transparent cover 660 and a light source 670. Specifically, as shown in FIG. 7, the transparent cover 660 is arranged at the first end 611 of the outer housing 610 to seal the probe 60. In some embodiments, the transparent cover 660 rests against and/or is affixed to the mounting flange 6111 of the outer housing 610 within the housing. The transparent cover 660 may be a circular transparent cover 660, which is made, for example, of a material such as clear glass, clear plastic, etc. The camera 630 has a lens side facing the transparent cover 660 to receive incident light through the transparent cover 660. In some embodiments, the lens of the camera 630 may be arranged resting against the transparent cover 660 to assist in positioning and fixing the camera 630 and the transparent cover 660. The lens of camera 630 may be a HD 1080P waterproof camera. The lens of camera 630 may be a 145-degree wide angle camera.

As shown in FIG. 7, the probe 60 further includes a light source 670. A plurality of light sources 670 are arranged around the camera 630 on the inside of the transparent cover 660 to illuminate the environment in front of the probe 60, thereby providing light to the camera 630. The light sources 670 may be LED light beads. In some embodiments, the light sources 670 include six LED light beads with adjustable brightness. In some embodiments, the light sources 670 each may be a diffuse light source 670.

Figure 8:
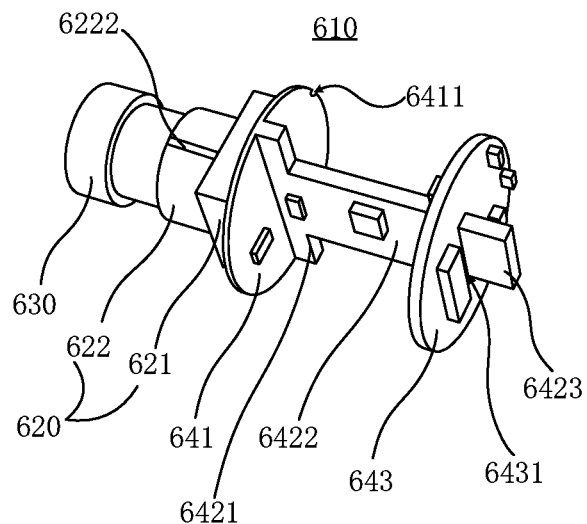
FIG. 8 is a schematic view of a camera, a base, and a circuit module according to an embodiment of the present disclosure.

Referring to FIG. 8 and FIG. 6, FIG. 8 is a schematic view of a camera 630, a base 620, and a circuit module 640 according to an embodiment of the present disclosure.

As shown in FIG. 8, the base 620 may include a rectangular body 621 and a columnar mount 622 extending from the rectangular body 621. The rectangular body 621 has a rectangular cross-section and a cross-section perpendicular to the rectangle has a thickness. In some embodiments, the rectangular body 621 has a square cross-section. The columnar mount 622 is a substantially cylindrical structure with a side connected to the rectangular body 621. A surface of the columnar mount 622 may be arranged with at least one longitudinal protrusion 6222 to increase the surface heat dissipation area of the columnar mount 622.

In some embodiments, the rectangular body 621 and the columnar mount 622 are integrally formed. In some embodiments, the columnar mount 622 may be fixed to the rectangular body 621, for example, by bonding.

The base 620 may be made of a metallic material to facilitate heat dissipation. Of course, it should be understood by those skilled in the art that the base 620 may also be made of other materials such as plastic, ceramic, composite materials, etc., and the present disclosure is not limited to this.

The rectangular body 621 of the base 620 defines a through hole through the rectangular body 621 to facilitate passing wires, etc. The columnar mount 622 defines a threaded through hole through the columnar mount 622 and connected to the through hole of the rectangular body 621 to facilitate mounting the camera 630 and passing wires through it.

As shown in FIG. 8, the camera 630 is connected to the threaded through hole of the base 620. Specifically, the camera 630 is arranged with a thread on a side of the camera 630 back from the lens, and the camera 630 is connected to the threaded through hole of the base 620 by means of a threaded connection. The camera 630 may also be fixedly connected to the base 620 in other ways, which are not limited by the present disclosure. The camera 630 has a lens surface facing the first end 611 of the outer housing 610.

As shown in FIGS. 6 and 8, the circuit module 640 includes a first circuit module 641, a second circuit module 642, and a third circuit module 643 that are electrically connected. Specifically, the first circuit module 641 is fixed to a side of the base 620 away from the camera 630. An end of the second circuit module 642 is connected to the first circuit module 641 and is arranged vertically to the first circuit module 641. The third circuit module 643 is connected to the other end of the second circuit module 642 and is arranged parallel to the first circuit module 641.

As shown in FIG. 8, the first circuit module 641 is in the shape of a disk. The first circuit module 641 is fixedly connected to the base 620 on a side of the disc. In some embodiments, the first circuit module 641 is bonded to the rectangular body 621 of the base 620 on a side of the disc. A side of the first circuit module 641 away from the base 620 may be arranged with electronic components. A side of the first circuit module 641 close to the base 620 may lead wires that are electrically connected to the camera 630 through the through hole of the base 620.

In some embodiments, at least one notch 6411 may be defined on a circumference of the disk of the first circuit module 641 for positioning the signal transmitter 650. Specifically, corresponding protrusions on the signal transmitter 650 may be embedded in the notches 6411 of the first circuit module 641, thereby achieving alignment of the signal transmitter 650 with the circuit module 640. The notches 6411 of the first circuit module 641 may be arranged equidistantly on the circumference of the disk, which is not limited in the present disclosure.

As shown in FIG. 8, in some embodiments, the second circuit module 642 is a circuit board in a substantially T-shaped structure. Specifically, the T-shaped structure includes a base portion 6421 and a protruding portion 6422. The base portion 6421 forms a horizontal portion of the T-shaped structure and the protruding portion 6422 forms a vertical portion of the T-shaped structure. The base portion 6421 is fixedly connected to the first circuit module 641, for example, by bonding, ultrasonic welding, etc. In some embodiments, the base portion 6421 is connected to the first circuit module 641 substantially along the diameter of the disk of the first circuit module 641. In some embodiments, the protruding portion 6422 may be continuously tapered in a direction away from the base portion 6421. In some embodiments, the protruding portion 6422 extends at an end away from the base portion 6421 to form an insertion portion 6423, with the width of the insertion portion 6423 being less than the protruding portion 6422. For example, as shown in FIG. 6, the protruding portion 6422 forms the insertion portion 6423 at an end away from the base portion 6421, thereby forming at least one step. In some embodiments, the protruding portion 6422 may be continuously tapering in a direction away from the base portion 6421 such that the protruding portion 6422 has a substantially trapezoidal structure.

As shown in FIGS. 6 and 8, the third circuit module 643 is in the shape of a disk. In some embodiments, the disk diameter of the third circuit module 643 is substantially equal to the disk diameter of the first circuit module 641. Electronic components may be arranged on a side of the disk of the third circuit module 643 away from the first circuit module 641. In some embodiments, the third circuit module 643 is arranged with a slit 6431. The slit 6431 may be defined along the diameter of the disk of the third circuit module 643. The insertion portion 6423 of the second circuit module 642 is inserted in the slit 6431 and may be fixed to the third circuit module 643 by means of bonding or ultrasonic welding, etc.

Figure 9:
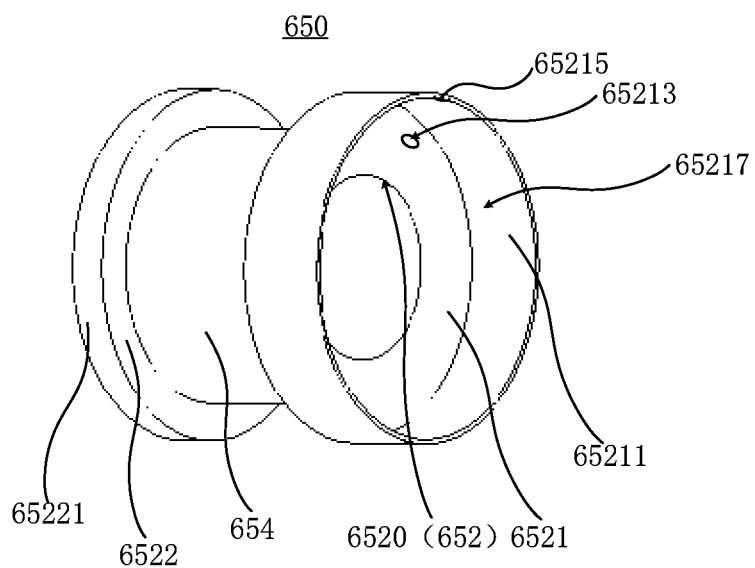
FIG. 9 is a schematic view of a signal transmitter according to an embodiment of the present disclosure.
Figure 10:
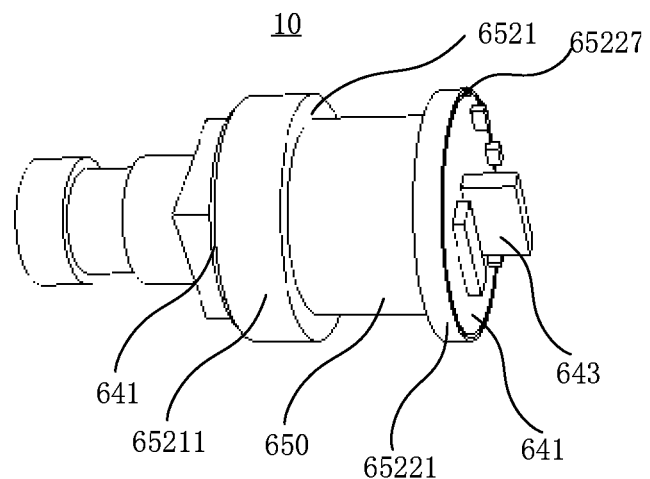
FIG. 10 is a schematic view of a signal transmitter assembled with a circuit module according to an embodiment of the present disclosure.

Referring to FIGS. 9 and 10, FIG. 9 is a schematic view of a signal transmitter 650 according to an embodiment of the present disclosure, and FIG. 10 is a schematic view of a signal transmitter 650 assembled with a circuit module 640 according to an embodiment of the present disclosure.

Specifically, the signal transmitter 650 is arranged within the outer housing 610 to detect the position of the probe 60. The signal transmitter 650 may be electrically connected to the circuit module 640 and subsequently to the cable 30.

Specifically, the signal transmitter 650 can transmit a wireless signal such as Wi-Fi, AM, FM, etc. The signal receiver 40 of the detection system 1 can receive the wireless signal and position the signal transmitter 650 based on the signal, and subsequently determine the position of the probe 60. In some embodiments, the signal transmitter 650 may be a 512 Hz transmitter.

In some embodiments, the user may issue a position command when observing on the detection terminal box 20 that the probe 60 is in a fault position or blockage position within the pipe. The command is transmitted through the cable 30 to the circuit module 640. The circuit module 640 controls the signal transmitter 650 to generate a positioning signal. The signal receiver 40 receives the positioning signal. The detection system 1 obtains the position of the probe 60 based on the positioning signal.

As shown in FIG. 9, the signal transmitter 650 includes a holder 652 and a coil 654.

Specifically, the holder 652 includes a columnar body portion 6520, which is hollow and is sleeved outside of the circuit module 640, particularly outside of the second circuit module 642.

Specifically, the coil 654 is wound around the body portion 6520 and ends of the coil 654 are connected to the circuit module 640. In some embodiments, the coil 654 is an enameled wire, in particular a copper wire coated with an insulating layer. Two ends of the copper wire are led from an end of the columnar body portion 6520 to be electrically connected to the circuit module 640.

In the embodiment shown in FIG. 9, the holder 652 further includes a first flange 6521 and a second flange 6522.

Specifically, the first flange 6521 is connected to an end of the body portion 6520 near the camera 630 and projects outwardly along the radial direction of the body portion 6520. An outer periphery of the first flange 6521 is arranged with a first sidewall 65211. The first sidewall 65211 extends parallel to the axial direction of the body portion 6520 to define a first holding cavity 65217, and a portion of the circuit module 640 is housed within the first holding cavity 65217. In particular, the first circuit module 641 is housed in the first holding cavity 65217.

Specifically, the second flange 6522 is connected to the other end of the body portion 6520 away from the camera 630 and projects outwardly along the radial direction of the body portion 6520. The second flange 6522 is arranged with a second sidewall 65221 at the outer periphery. The second sidewall 65221 extends parallel to the axial direction of the body portion 6520 to define a second holding cavity 65227 (as shown in FIG. 10), and a portion of the circuit module 640 is housed within the second holding cavity 65227. In particular, the third circuit module 643 is housed within the second holding cavity 65227.

In some embodiments, the first flange 6521 and the second flange 6522 are seated within the outer housing 610 by means of an interference fit. In particular, the first sidewall 65211 of the first flange 6521 and the second sidewall 65221 of the second flange 6522 are seated within the outer housing 610 by means of an interference fit.

With the arrangement as described above, the holder 652 of the signal transmitter 650 can accommodate the circuit module 640, as shown in FIG. 10, and by the interference fit of the holder 652 to the outer housing 610, the signal transmitter 650 can help position and retain the circuit module 640 as well as the camera 630 within the outer housing 610.

In some embodiments, at least one opening 65213 may be defined on the first flange 6521 of the signal transmitter 650, and leads at both ends of the coil 654 may be connected to the circuit module 640 through the at least one opening 65213. In some embodiments, the first flange 6521 may further be arranged with at least one protrusion 65215 that matches with the notch 6411 on the first circuit module 641 and can be embedded in the notch 6411 to help align the signal transmitter 650 and the circuit module 640.

Figure 11:
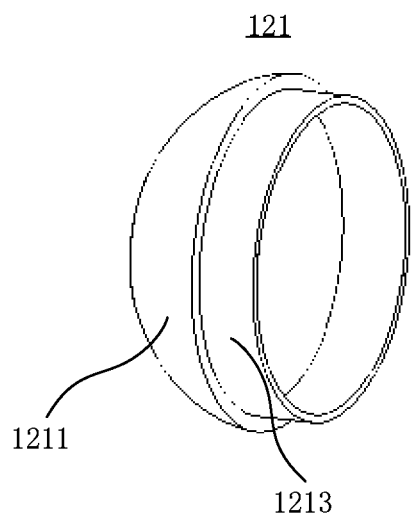
FIG. 11 is a schematic view of a first connector according to an embodiment of the present disclosure.

Referring to FIG. 11, FIG. 11 is a schematic view of a first connector 121 according to an embodiment of the present disclosure.

As shown in FIG. 11, the first connector 121 includes a first housing 1211 that defines a substantially hemispherical table structure, and the cross-section of the first housing 1211 tapers in a direction away from the probe 60. The hemispherical table structure is a hemisphere with the top truncated to form a top plane. The top plane is parallel to the bottom surface of the hemispherical table structure. A first attachment portion 1213 extends from a side of the first housing 1211 toward the probe 60 for connection to the second end 612 of the outer housing 610 of the probe 60. In some embodiments, the first attachment portion 1213 includes a thread for threaded connection to the second end 612 of the outer housing 610. In some embodiments, the first attachment portion 1213 may be a snap-fit member for snap-fit connection to the second end 612 of the outer housing 610. In some embodiments, the flexible connecting member 130 is connected to an end of the first housing 1211 away from the probe 60. The first connector 121 may define an intermediate pathway for passing through the wire.

Figure 12:
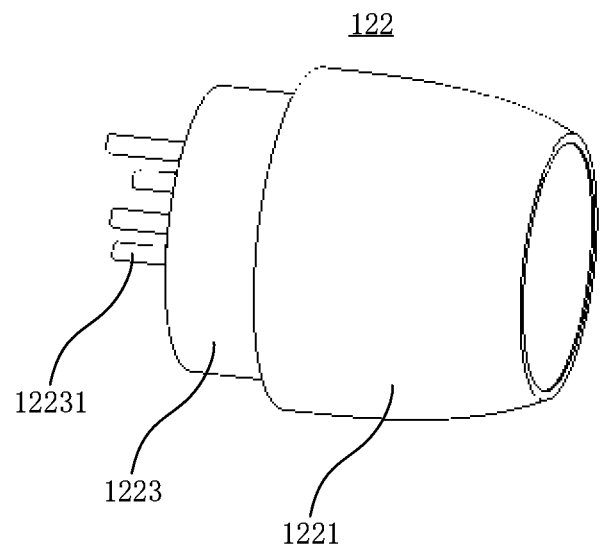
FIG. 12 is a schematic view of a second connector according to an embodiment of the present disclosure.

Referring to FIG. 12, FIG. 12 is a schematic view of a second connector 122 according to an embodiment of the present application.

As shown in FIG. 12, the second connector 122 includes a second housing 1221 that defines a substantially columnar structure. In some embodiments, the second housing 1221 defines a substantially conical or truncated conical structure, and the cross section of the second housing 1221 tapers in a direction close to the probe 60. In some embodiments, the second housing 1221 defines a substantially spindle-shaped structure. In some embodiments, the spindle-shaped structure may be asymmetrical, for example, the spindle-shaped structure is more pointed at an end away from the probe 60.

In some embodiments, as shown in FIG. 12, a plug 1223 extends from a side of the second housing 1221 away from the probe 60 for connection to an external device. The external device is, for example, the cable 30 described above. As shown in FIG. 12, the plug 1223 may include at least one plug pin 12231. It should be understood by those skilled in the art that the plug 1223 may also take other forms, which are not limited by the present disclosure.

In some embodiments, the flexible connecting member 130 is connected to an end of the second housing 1221 close to the probe 60 as shown in FIG. 5 and FIG. 12.

Figure 13:
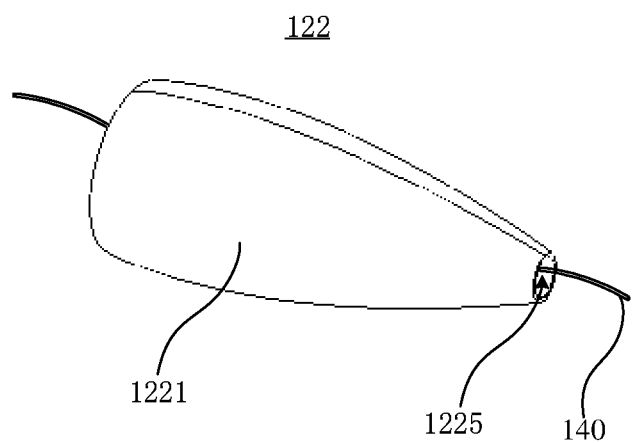
FIG. 13 is a schematic view of a second connector according to another embodiment of the present disclosure.
Figure 14:
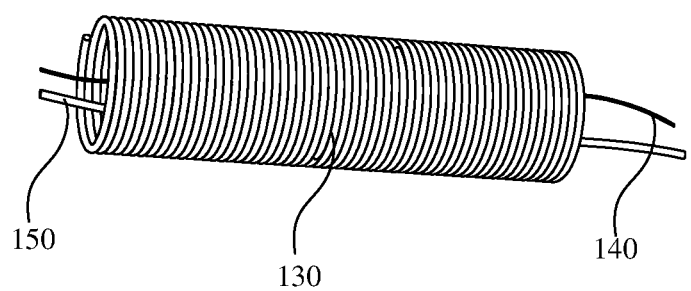
FIG. 14 is a schematic view of a flexible connecting member according to an embodiment of the present disclosure.

Referring to FIG. 13, FIG. 13 is a schematic view of a second connector 122 according to another embodiment of the present disclosure. As shown in FIG. 14, the second connector 122 may be free of a plug 1223. Instead, the second connector 122 defines an internal through hole 1225 through which the transmission line 140 is electrically connected to an external device such as the cable 30. The transmission line 140 may be fixed in the internal through hole 1225 by an adhesive such as resin, and the through hole 1225 may be sealed by the adhesive such as resin.

Referring to FIG. 14 and in conjunction with FIGS. 4 and 5, FIG. 14 is a schematic view of a flexible connecting member 130 according to an embodiment of the present disclosure. The flexible connecting member 130 can be bent and deformed to allow the probe 60 to change the angle of detection. The flexible connecting member 130 is illustrated in FIG. 14 as an elastic member, in particular a spring. The elastic member may be made, for example, of an elastic material such as an elastic metal, an elastic ceramic, an elastic composite, a rubber, etc., without limitation in the present disclosure. An end of the flexible connecting member 130 is fixedly connected to a side of the first connector 121 away from the probe 60, and the other end is fixedly connected to a side of the second connector 122 close to the probe 60.

Figure 15:
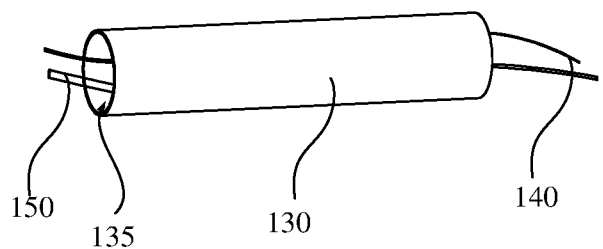
FIG. 15 is a schematic view of a flexible connecting member according to another embodiment of the present disclosure.

Referring to FIG. 15, FIG. 15 is a schematic view of a flexible connecting member 130 according to another embodiment of the present disclosure. As shown in FIG. 15, the flexible connecting member 130 is a columnar flexible member and is in the form of a hollow tube. The flexible connecting member 130 may be made, for example, of an elastic material such as an elastic metal, an elastic ceramic, an elastic composite, a rubber, etc., without limitation in the present disclosure.

The flexible connecting member 130, as shown in FIG. 14 or FIG. 15, can be sleeved outside of the transmission line 140 and the flexible protective member 150 to protect the transmission line 140 and the flexible protective member 150. For example, as shown in FIG. 15, the flexible connecting member 130 defines an internal pathway 135 which the transmission line 140 and the flexible protective member 150 penetrate.

Figure 16:
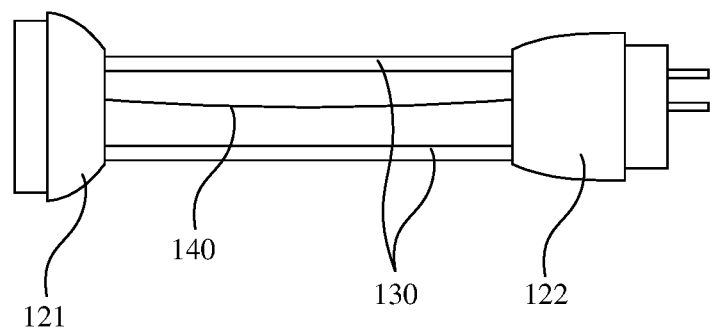
FIG. 16 is a schematic view of a flexible connecting member according to further another embodiment of the present disclosure.

In some embodiments, referring to FIG. 16, the transmission line 140 may be arranged side-by-side with the flexible connecting member 130 and need not be within the flexible connecting member 130. FIG. 16 illustrates a plurality of flexible connecting members 130 disposed symmetrically between the first connector 121 and the second connector 122. The transmission line 140 is disposed between the first connector 121 and the second connector 122 and is disposed side-by-side with the flexible connecting members 130.

Referring again to FIG. 5, as shown in FIG. 5, an end of the transmission line 140 penetrates the first connector 121 and is connected to the probe 60, and the other end is connected to the second connector 122, for transmitting the detection data collected by the probe 60 to the cable 30.

In some embodiments, an end of the transmission line 140 is fixed in the first connector 121 while penetrating the first connector 121. For example, the transmission line 140 is fixed at the first connector 121 by adhesive, resin, etc., and protrudes from the first connector 121 to connect to the circuit module 640.

In some embodiments, the other end of the transmission line 140 is fixedly connected to the second connector 122 and is electrically connected to the plug 1223 (refer to FIG. 12) of the second connector 122 to electrically connect to the external device through the plug 1223. In some embodiments, as shown in FIG. 13, the other end of the transmission line 140 penetrates the second connector 122, is fixed in the second connector 122, and protrudes from the second connector 122 to connect to the external device. For example, the transmission line 140 is fixed at the second connector 122 by adhesive, resin, etc.

The transmission line 140 may be configured to transmit data. In some embodiments, the transmission line 140 may also be configured to transmit electrical power. The transmission line 140 may be a wire common in the art and may be a single strand or multiple strand wire, without limitation in the present disclosure.

Referring to FIG. 5, an end of the flexible protective member 150 is connected to the first connector 121 and the other end is connected to the second connector 122. The flexible protective member 150 is a flexible member of substantially non-stretchable length that is greater than the length of the flexible connecting member 130 in its natural state and less than the length of the transmission line 140 between the first connector 121 and the second connector 122. By this configuration of the flexible protective member 150, the flexible protective member 150 allows the flexible connecting member 130 or the flexible member to undergo deformation. In the event of deformation of the flexible connecting member 130 or the flexible member, the flexible protective member 150 maintains the connection between the first connector 121 and the second connector 122, thereby protecting the connection between the transmission line 140 and the first connector 121 and the second connector 122, as well as protecting the transmission line 140 from being pulled or torn.

In some embodiments, the flexible protective member 150 is arranged in parallel with the transmission line 140 as shown in FIG. 5. The flexible protective member 150 may be in the form of a wire. The flexible protective member 150 may be a rope consisting of a plurality of fibers. The fibers are, for example, nylon fibers, vegetable fibers, glass fibers, etc. In some embodiments, the flexible protective member 150 may be a metal strand formed by a plurality of metal wires twisted together. The flexible protective member 150 may also be constructed of other materials, as long as it can be flexibly bent but substantially inelastically stretched.

Figure 17:
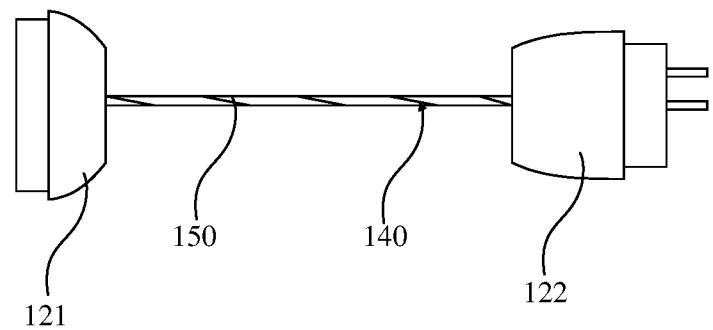
FIG. 17 is a schematic view of an arrangement of a flexible protective member with a transmission line according to an embodiment of the present disclosure.

In some embodiments, as shown in FIG. 17, the flexible protective member 150 is in the form of a wire, and the transmission line 140 is wound around the outside of the flexible protective member 150. For clarity, the flexible connecting member 130 is omitted in FIG. 17. By winding the transmission line 140 around the flexible protective member 150, the flexible protective member 150 may further provide structural support for the transmission line 140, reducing its bending, shaking, etc., and increasing the service life of the transmission line 140.

Figure 18:
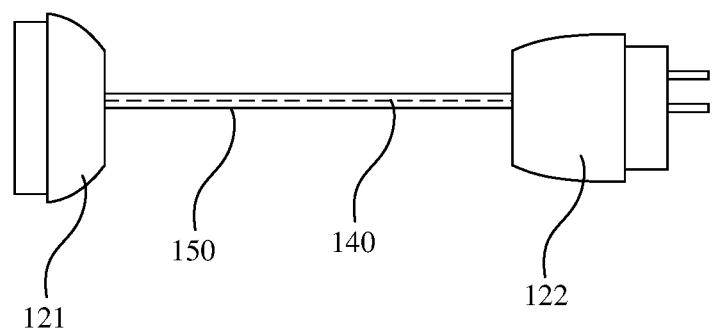
FIG. 18 is a schematic view of an arrangement of a flexible protective member with a transmission line according to another embodiment of the present disclosure.

In some embodiments, as shown in FIG. 18, the flexible protective member 150 is in the form of a hollow tube and is sleeved outside the transmission line 140. For clarity, the flexible connecting member 130 is omitted in FIG. 18. By sleeving the flexible protective member 150 outside the transmission line 140, the flexible protective member 150 may provide structural support for the transmission line 140, reducing its bending, shaking, etc. Further, the flexible protective member 150 may protect the surface structure of the transmission line 140, reduce the impact of external dust, temperature changes, etc. on the transmission line 140, and increase the life span of the transmission line 140. In some embodiments, the flexible protective member 150 may be a sheath woven from wire, nylon fiber, etc. In some embodiments, the flexible protective member 150 may be a flexible plastic hollow tube.

In summary, the detector 10 of the present disclosure includes a flexible connecting member 130 fixed between a first connector 121 and a second connector 122 and a flexible protective member 150. An end of the flexible protective member 150 is connected to the first connector 121 and the other end of the flexible connecting member 130 is connected to the second connector 122. The length of the flexible protective member 150 is set to be greater than the length of the flexible connecting member 130 in its natural state and less than the length of the transmission line 140 between the first connector 121 and the second connector 122. With this arrangement, when the flexible connecting member 130 is bent or stretched, the flexible protective member 150 can limit the length of the flexible connecting member 130 after deformation to be less than the length of the flexible protective member 150. Since the length of the flexible protective member 150 is less than the length of the transmission line 140 between the first connector 121 and the second connector 122, the flexible protective member 150 can limit the length of the flexible connecting member 130 after deformation to be less than the length of the transmission line 140 between the first connector 121 and the second connector 122, thereby ensuring that the transmission line 140 is not stretched and thus protecting the transmission line 140.

Figure 19:
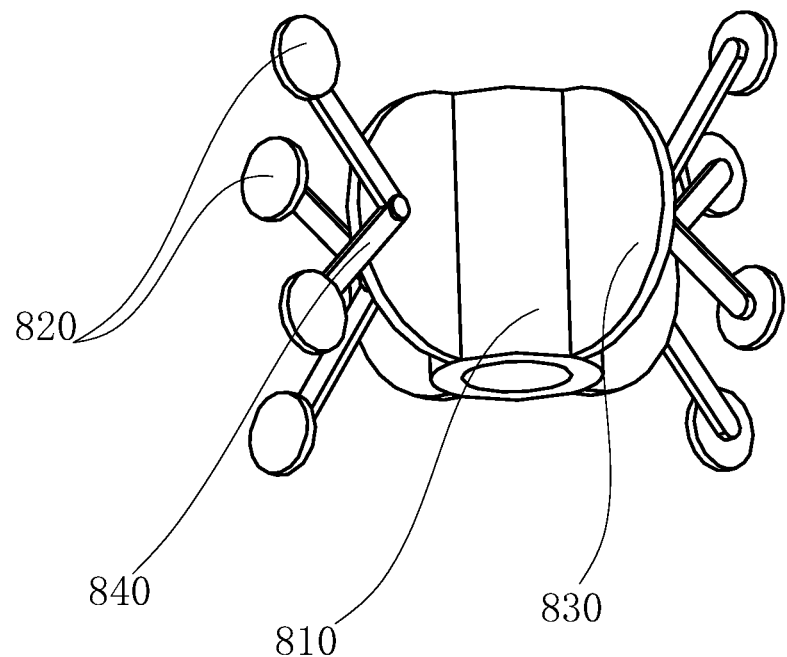
FIG. 19 is a schematic view of a protective sleeve according to an embodiment of the present disclosure.
Figure 20:
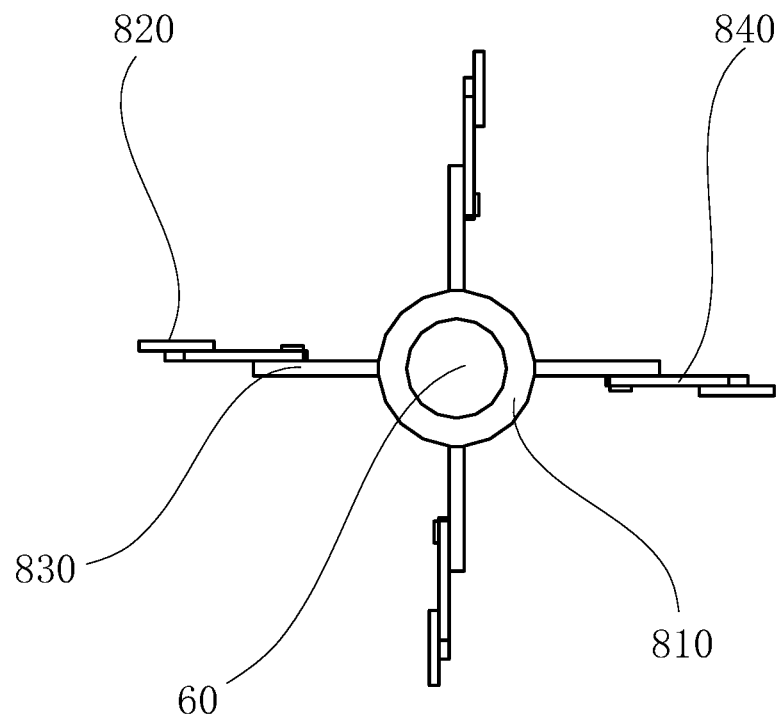
FIG. 20 is a side view of a detector fitted with a protective sleeve according to an embodiment of the present disclosure.

Referring to FIG. 19 and FIG. 20, FIG. 19 is a schematic view of a protective sleeve 800 according to an embodiment of the present disclosure, and FIG. 20 is a side view of a detector 10 with a protective sleeve 800 according to an embodiment of the present disclosure.

As shown in FIGS. 19 and 20, the protective sleeve 800 includes a protective housing 810 and a plurality of pulleys 820 connected to the protective housing 810. The protective housing 810 may be sleeved on the probe 60 of the detector 10 to protect the probe 60. In some embodiments, the protective housing 810 sleeved on the probe 60 may extend beyond the first end 611 of the probe 60 to protect the camera 630 and other structures in the probe 60. When the detector 10 enters the pipe, the pulleys 820 of the protective sleeve 800 can slide along the inner wall of the pipe, making it easier to move the probe 10 within the pipe, while preventing the side wall of the detector 60 from coming into direct contact with the inner wall of the pipe, further protecting the probe 10.

As shown in FIG. 19, the protective sleeve 800 further includes a rib 830 arranged on the protective housing 810 and a pulley arm 840 connected to the rib 830. The rib 830 may be integrally formed with the protective housing 810, the pulley arm 840 is rotatably connected to the rib 830, for example, by a threaded connection, and at least one end of the pulley arm 840 is arranged with the pulley 820. In some embodiments, as shown in FIG. 19, the pulley arm 840 is a V-shaped arm. A middle portion of the V-shaped arm is rotatably connected to the rib 830. One pulley 820 is arranged at each end of the V-shaped arm. The V-shaped arm can be rotated relative to the rib 830 to adjust the position of the two pulleys 820 on the V-shaped arm to facilitate steering of the detector 10 within the pipe. Four ribs 830 and four pulley arms 840 evenly distributed around the housing of the protective sleeve 800 are shown in FIGS. 19 and 20. It should be understood by those skilled in the art that the protective sleeve 800 may include other numbers of ribs 830 and pulley arms 840, and the present disclosure is not limited in this regard.

Figure 21:
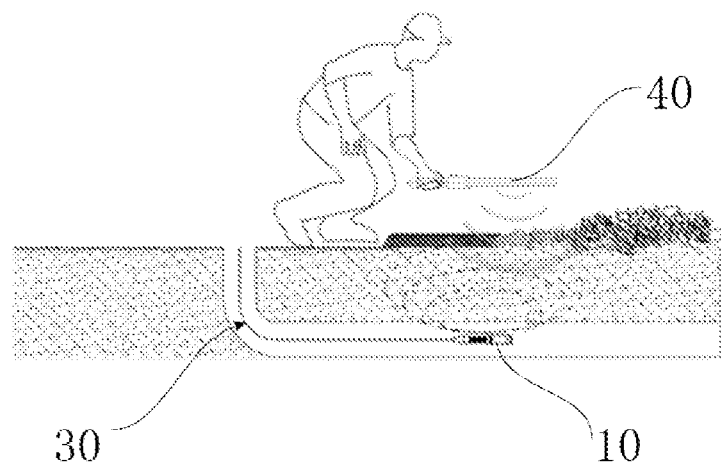
FIG. 21 is a schematic view of a working principle of a signal receiver.

The signal receiver 40 of the present disclosure will be described below Specifically, referring to FIG. 21, FIG. 21 is a schematic view of a working principle of the signal receiver 40. As shown in FIG. 21, the detector 10 transmits a positioning signal. The signal receiver 40 receives the positioning signal. The less the distance of the signal receiver 40 from the detector 10, the stronger the positioning signal received by the signal receiver 40. The position where the signal received by the signal receiver 40 is strongest corresponds to the position of the detector 10. In some embodiments, the central operating frequency of the signal receiver 40 is 512 Hz. It should be understood by those skilled in the art that the signal receiver 40 may operate using other frequencies or frequency ranges, which are not limited by the present disclosure. The signal receiver 40 shown in FIG. 21 is intended only to illustrate the positioning principle of the signal receiver 40 and is not intended to limit the specific shape and other features of the signal receiver 40 of the present disclosure.

Figure 22:
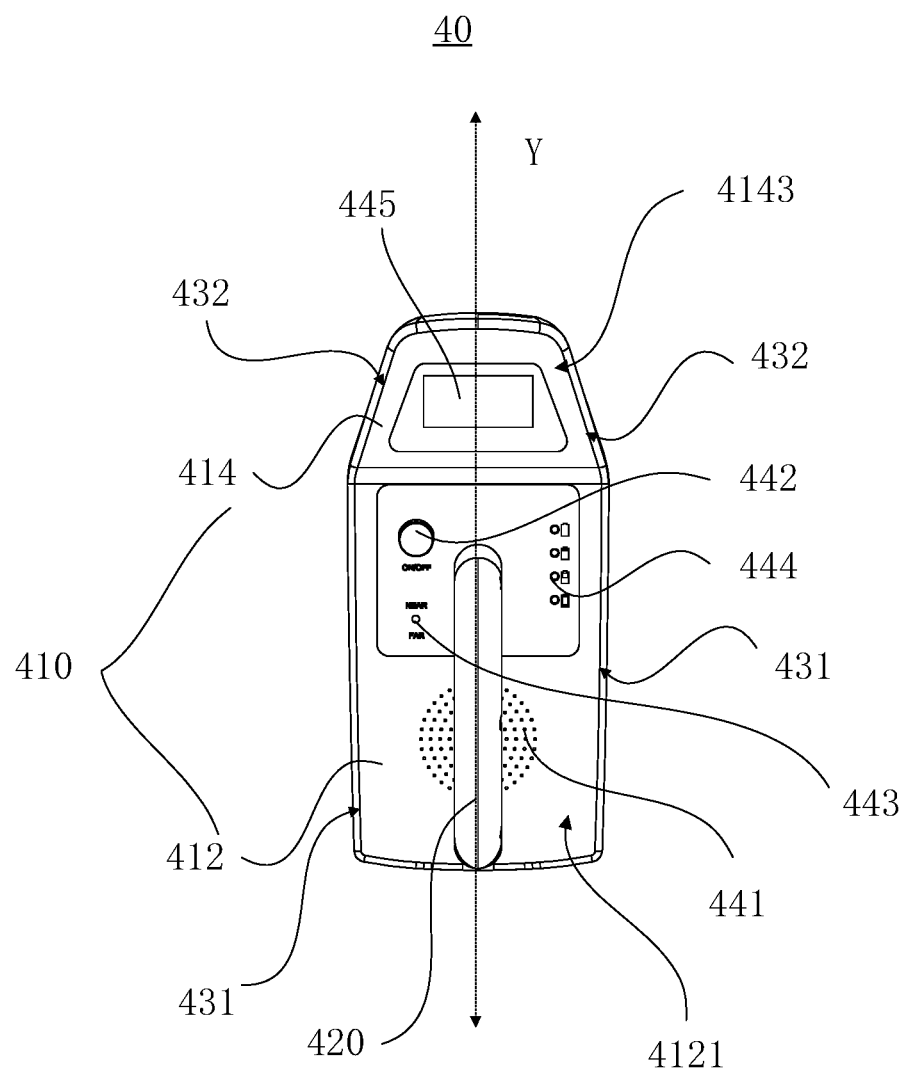
FIG. 22 is a front view of a signal receiver according to an embodiment of the present disclosure.
Figure 23:
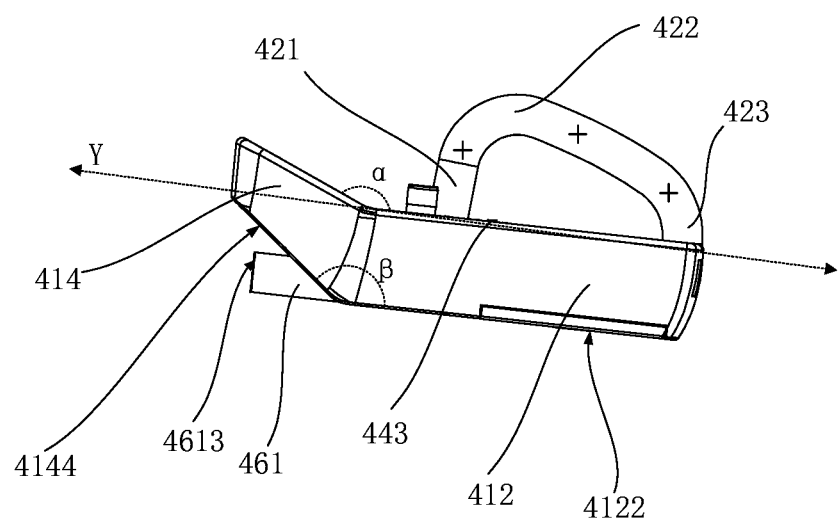
FIG. 23 is a side view of a signal receiver according to an embodiment of the present disclosure.
Figure 24:
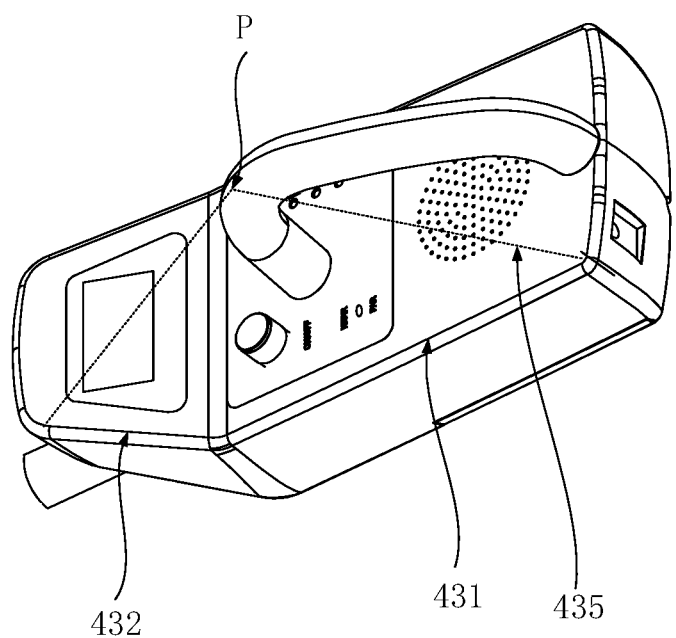
FIG. 24 is a perspective view of a signal receiver according to an embodiment of the present disclosure.
Figure 25:
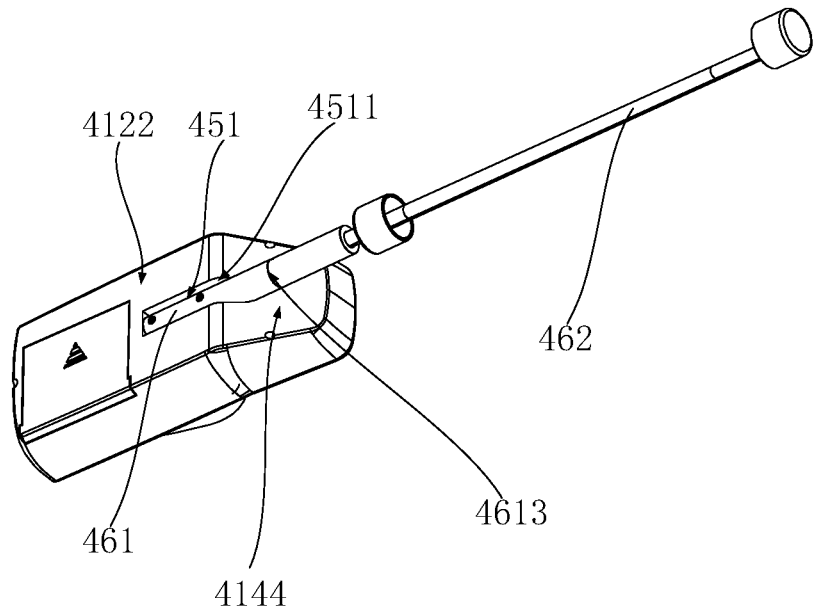
FIG. 25 is another perspective view of a signal receiver according to an embodiment of the present disclosure.

Referring to FIGS. 22-25, FIG. 22 is a front view of the signal receiver 40 according to an embodiment of the present disclosure, FIG. 23 is a side view of the signal receiver 40, FIG. 24 is a perspective view of the signal receiver 40, and FIG. 25 is another perspective view of the signal receiver 40.

As shown, the signal receiver 40 may include a housing 410 and a handle 420 arranged on the housing 410. The housing 410 is configured to hold components of the signal receiver 40. The handle 420 is configured to be gripped by a user.

Specifically, the housing 410 has a longitudinal axis Y and extends in the longitudinal axis Y direction (also referred to as a first direction). The housing 410 may internally define a holding cavity. The electronic components, batteries, and other components of the signal receiver 40 may be arranged within the holding cavity. The housing 410 may be made, for example, of hard plastic, metal, ceramic, and other materials, and the present disclosure is not limited to this.

As shown, the housing 410 may include a body 412 and a protrusion 414 that are connected to each other.

In some embodiments, the body 412 includes a first face 4121 and a second face 4122 disposed opposite each other. The first face 4121 is on a front side of the signal receiver 40 and the second face 4122 is on a back side of the signal receiver 40. Both the first face 4121 and the second face 4122 are substantially flat surfaces and the present disclosure is not limited thereto.

In some embodiments, the protrusion 414 extends inclinedly from the body 412. Specifically, the protrusion 414 extends from the body 412 along the longitudinal axis Y of the signal receiver 40. Further, the protrusion 414 extends relative to the first face 4121 of the body 412 in a direction away from the second face 4122 of the body 412. The protrusion 414 in an inclined configuration relative to the body 412 in combination with the handle 420 protects the components on the front side of the signal receiver 40. For example, when the signal receiver 40 is inadvertently dropped, the protrusion 414 and the handle 420 touch the ground and may protect the components arranged on the front side of the signal receiver 40 from being damaged.

In some embodiments, the protrusion 414 includes a third face 4143 and a fourth face 4144 disposed opposite each other. Specifically, the third face 4143 is on a front side of the signal receiver 40 and the fourth face 4144 is on a back side of the signal receiver 40. Specifically, the third face 4143 is connected to the first face 4121 of the body 412 and is inclined with respect to the first face 4121. An included angle between the third face 4143 and the first face 4121 is α. The angle α has a magnitude of, for example, 135° to 175°. In some embodiments, the angle α has a magnitude of 150°. Specifically, the fourth face 4144 is connected to the second face 4122 of the body 412 and is inclined with respect to the second face 4122. An included angle between the fourth face 4144 and the second face 4122 is β. The angle β has a magnitude of, for example, 120° to 150°. In some embodiments, the angle α has a magnitude of 135°. The angle β may be less than the angle α.

As shown, the handle 420 is arranged on the first face 4121 of the body 412. In some embodiments, the handle 420 may be made of the same material as the housing 410. In some embodiments, the handle 420 may be integrally formed with at least a portion of the housing 410.

As shown, referring to FIG. 23, the handle 420 is arranged along the longitudinal axis Y of the signal receiver 40 and may be centered on the first face 4121 of the body 412. In some embodiments, the handle 420 may be arranged on the first face 4121 of the body 412 along the lateral direction of the signal receiver 40, which is not limited in the present disclosure.

In some embodiments, the handle 420 includes a first leg 421, a second leg 422, and a grip bar 423 connected to both the first leg 421 and the second leg 422. The first leg 421 is arranged closer to the protrusion 414 on the first face 4121 relative to the second leg 422. The length of the first leg 421 may be greater than the length of the second leg 422. The first leg 421 and the second leg 422 may have a straight or curved shape, which is not limited by the present disclosure. A gap is defined between the grip bar 423 and the first face 4121 for the user to grip. In some embodiments, a side of the grip bar 423 facing the first face 4121 may include at least one protrusion to facilitate the user's grip.

As shown, referring to FIG. 24, the first face 4121 of the body 412 includes two first side edges 431 and the third face 4143 of the protrusion 414 includes two second side edges 432. The first side edges 431 and second side edges 432 disposed on a side of the signal receiver 40 may define a first plane 435. The first side edges 431 and second side edges 432 disposed on the other side of the signal receiver 40 may define another first plane 435 (not shown). There exists and exists only one intersection P between the handle 420 and each of the first planes 435. By this configuration, when the signal receiver 40 falls, the first side edges 431, the second side edges 432, and the intersection P of the signal receiver 40 may touch the ground, i.e., the first plane 435 substantially coincides with the ground. In this way, the components arranged on the front side of the signal receiver 40 (including on the first face 4121 of the body 412 and the third face 4143 of the protrusion 414) may not directly touch the ground, thereby protecting the front side of the signal receiver 40 and the components arranged thereon.

As shown in FIG. 22, the front side of the signal receiver 40 includes components such as a speaker sound hole 441, a switch 442, an operating element 443, a power indicator 444, and a signal strength indicator 445.

In some embodiments, the speaker sound hole 441, switch 442, operating element 443, and power indicator 444 are arranged on the first face 4121 of the body 412. In some embodiments, the signal strength indicator 445 is arranged on the third face 4143 of the protrusion 414.

Specifically, the speaker sound hole 441 is arranged on the first face 4121, below the handle 420. In other words, the projection of the handle 420 on the first face 4121 is at least partially coincident with the speaker sound hole 441. The speaker sound hole 441 has, for example, the form of a set of through holes on the first face 4121. A speaker is arranged in the housing 410 directly opposite the speaker sound hole 441, and the speaker may emit a sound or vibration depending on the strength of the signal received by the signal receiver 40. The stronger the signal received by the signal receiver 40, the louder the sound of the speaker or the stronger the vibration or the higher the vibration frequency.

In some embodiments, when the user grips the handle 420, the back of the user's hand may be adjacent to or close to the speaker sound hole 441, such that the user's hand can directly feel the vibration of the speaker sound hole 441. It is convenient for the user to judge the received signal strength directly by the vibration strength of the speaker sound hole 441 without observing the signal strength display 445.

Specifically, the switch 442 may be arranged on the first face 4121 of the body 412. In some embodiments, the switch 442 may be arranged on the first face 4121 away from the handle 420 to prevent the user from accidentally operating the switch 442 while grasping the handle 420. In some embodiments, the switch 442 is a knob type switch 442, which is not limited by the present disclosure. In some embodiments, there is no intersection P between the switch 442 and the first plane 435, thereby protecting the switch 442.

Specifically, the operating element 443 may be arranged on a side of the handle 420 and disposed between the first leg 421 and the second leg 422. As shown, the operating element 443 is arranged between the first leg 421 and the second leg 422 and closer to the first leg 421. In this way, the operating element 443 can be easily operated by the user's fingers when the user grasps the handle 420.

In some embodiments, the operating element 443 is a signal receiver operating mode switch, and the signal receiver operating mode switch includes at least a near-field mode switching position and a far-field mode switching position. When the user is far away from the detector and the positioning signal received by the signal receiver 40 is weak, the far-field mode switch position may be applied to increase the detection distance and positioning signal search capability. When the user is closer to the detector and the positioning signal received by the signal receiver 40 is stronger, the near-field switch position may be applied to reduce the power consumption of the signal receiver 40 and enhance the resolution of the received positioning signal to position the detector more accurately.

In some embodiments, the signal receiver operating mode switch is a toggle to facilitate the user's finger to toggle the toggle for operating mode switching while the user is gripping the handle 420.

In some embodiments, there is no intersection between the operating element 443 and the first plane 435, thereby protecting the operating element 443.

Specifically, the power indicator 444 may be a plurality of LED indicators. Each indicator light indicates a different power status. As shown in FIG. 22, the power indicator 444 may include four LED indicators indicating full power, ¾ power, ½ power, and ¼ power, respectively. It should be understood by those skilled in the art that the power indicator 444 may include more or fewer LED indicators, and the present disclosure is not limited in this regard.

Specifically, the signal strength indicator 445 is arranged on the third face 4143. The signal strength indicator 445 may be a pointer-type signal indicator or an LED-type indicator, and the present disclosure is not limited in this regard. The signal strength indicator 445 can indicate the signal strength received by the signal receiver 40, and the user can select the operation mode of the signal receiver operation mode switch according to the signal strength.

As can be seen above, the handle 420 is arranged on the first face 4121, and the third face 4143 of the protrusion 414 is inclined with respect to the first face 4121, such that arranging the signal strength indicator 445 on the third face 4143 may facilitate the user to observe the signal strength indicator 445 while gripping the handle 420.

Those skilled in the art should understand that the signal receiver 40 of the present disclosure may include other components or other forms of component arrangement, which is not limited therein.

Referring to FIG. 25, as shown in FIG. 25, the housing 410 defines a recess 451. The recess 451 is recessed inwardly relative to the second face 4122 of the body 412 and the fourth face 4144 of the protrusion 414. In some embodiments, the recess 451 extends along the first direction or longitudinal axis Y. In some embodiments, the recess 451 is a linear recess 451. The recess 451 has an opening 4511 disposed in the protrusion 414. In some embodiments, the other end of the recess 451 opposite the opening 4511 is a blind end. In some embodiments, the other end of the recess 451 opposite the opening 4511 is an aperture, and the aperture may be in communication with the holding cavity of the housing 410.

As shown, the signal receiver 40 further includes an antenna holder 461 and an antenna 462.

Specifically, at least a portion of the antenna holder 461 is arranged in the recess 451. As shown, the antenna holder 461 is a columnar antenna holder 461, which is fixed in the recess 451 by screws, for example. The antenna holder 461 includes a connection end 4613. The connection end 4613 is exposed from the opening 4511 to be connected to an end of the antenna 462, for example by a threaded connection, etc. The other end of the antenna holder 461 may extend into the opening of the recess 451 and thereby connect to the components within the holding cavity.

In some embodiments, a projection of the connection end 4613 of the antenna holder 461 on a plane in which the second face 4122 is located is disposed within a projection of the protrusion 414 on the plane in which the second face 4122 is located. In this way, after the antenna 462 is removed from the antenna holder 461, the antenna holder 461 does not protrude from the protrusion 414 in the longitudinal direction, thereby facilitating storage of the signal receiver 40.

Specifically, as shown in FIG. 25, the antenna 462 is a linear antenna. The antenna 462 is removably connected to the connection end 4613 of the antenna holder 461 at an end.

Figure 26:
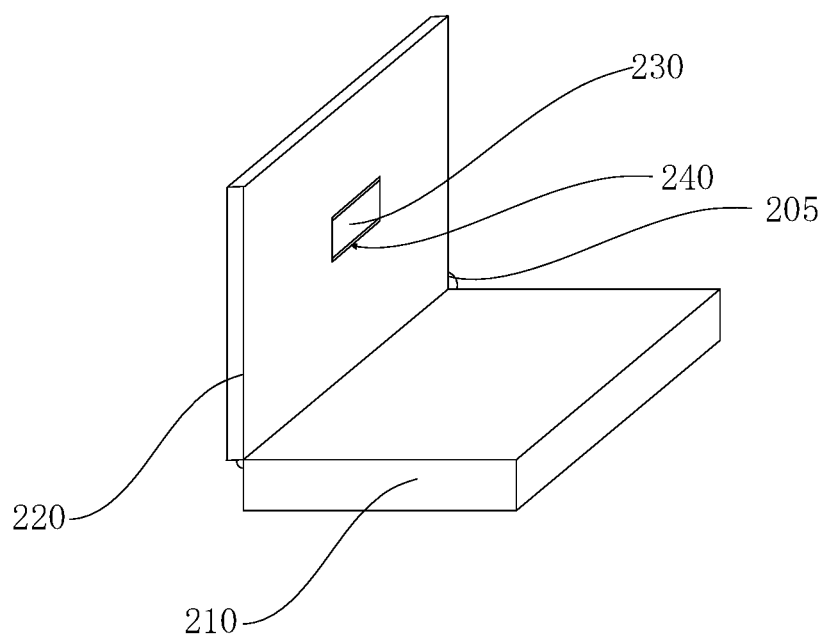
FIG. 26 is a schematic view of a detection terminal box according to an embodiment of the present disclosure.

Referring to FIGS. 1 and 26, the detection system 1 of the present disclosure further includes a detection terminal box 20 configured to process the detection data.

Specifically, as shown in FIG. 26, the detection terminal box 20 includes a first portion 210 and a second portion 220 that are collapsible together. The first portion 210 and the second portion 220 are rotatably connected, for example, by means of a hinge. When the first portion 210 and the second portion 220 folded together, the first portion 210 and the second portion 220 may cooperatively form a box body of the detection terminal box 20, and the user can push or carry the detection terminal box 20 to move around. When the first portion 210 and the second portion 220 are separated from each other, the detection terminal box 20 may be configured as a working platform. In this case, the second portion 220 is placed on the ground, table, or other countertop, as the base of the working platform.

In some embodiments, a limiter 205 may be arranged between the first portion 210 and the second portion 220 to limit the angle of rotation of the first portion 210 relative to the second portion 220.

Specifically, the detection system 1 includes a display 230 configured to display the detection data. The display 230 is, for example, a 7-inch LCD color display. In some embodiments, the display 230 is for example a touch screen display, the user can press the corresponding button or click, touch the display 230 to set whether to display the current time, whether to display the current release length of the cable 30, to zoom in or out a part of the current image, to display the current display brightness, etc., which is not limited therein. Specifically, the display 230 can simultaneously display/clear metric units and imperial units. In some embodiments, the display 230 includes a clear key to control the display and clearing of metric and imperial units.

Specifically, the display 230 is embedded within the first portion 210 of the detection terminal box 20. Specifically, the first portion 210 of the detection terminal box 20 includes a display compartment 240 in which the display 230 may be embedded.

Figure 27:
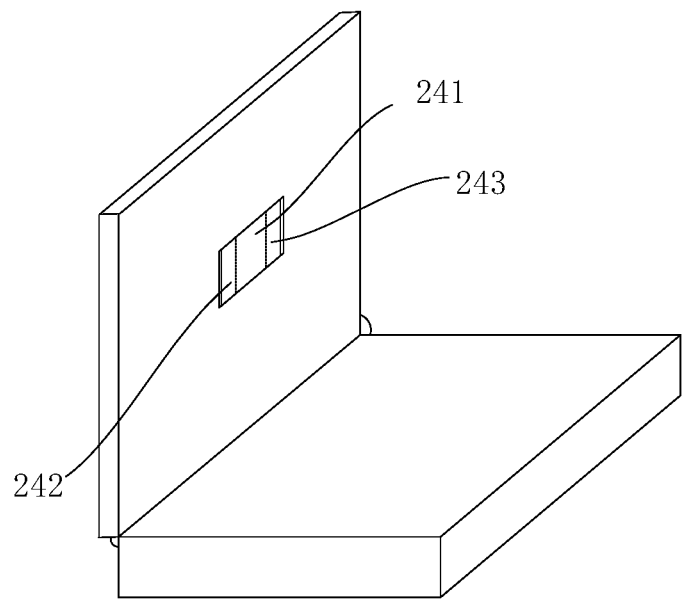
FIG. 27 is a schematic view of a display bin in a closed state according to an embodiment of the present disclosure.
Figure 28:
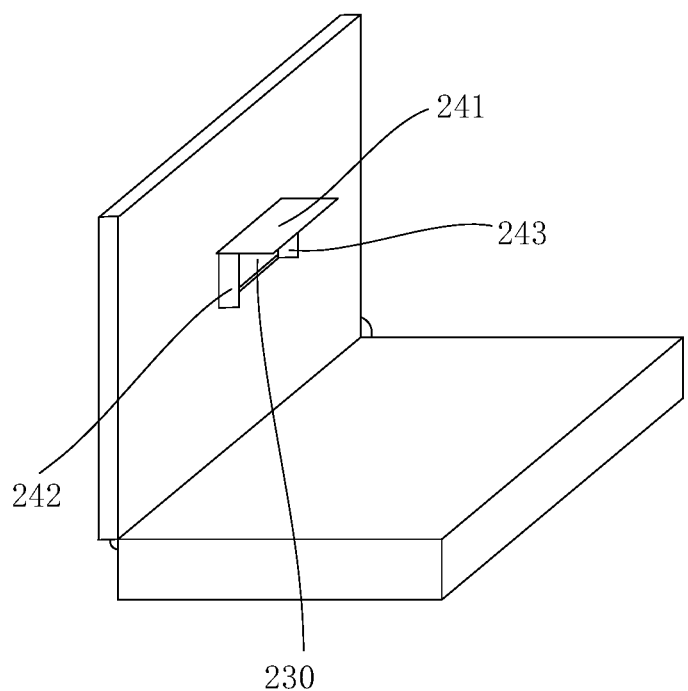
FIG. 28 is a schematic view of a display bin in an open state according to an embodiment of the present disclosure.

In some embodiments, as shown in FIGS. 27 and 28, the first portion 210 of the detection terminal box 20 further includes a main bin door 241, a first side bin door 242, and a second side bin door 243.

Specifically, as shown in FIG. 27, the main bin door 241 is rotatably connected to the first portion 210 for enclosing and exposing the display 230 within the display compartment 240. When the display 230 is needed for use, as shown in FIG. 28, the user can lift the main bin door 241 to expose the display 230. The upwardly lifted main bin door 241 also serves as a sunshade, allowing the display 230 to remain visible in well-lit outdoor conditions.

Specifically, the first side bin door 242 and the second side bin door 243 are each rotatably connected to the first portion 210 of the detection terminal box 20. Specifically, as shown in FIG. 27, the first side bin door 242 and the second side bin door 243 are arranged between the main bin door 241 and the display bin 240 and are arranged on both sides of the display bin 240. As shown in FIG. 28, when the main bin door 241 is lifted upward, the first side bin door 242 and the second side bin door 243 may subsequently be opened to support the main bin door 241 with the sides of the main bin door 241 facing upward. The first side bin door 242 and the second side bin door 243 may also serve as a sunshade.

In some embodiments, the first side bin door 242 and the second side bin door 243 may be rotatably connected to the first portion 210 of the detection terminal box 20 by elastic hinges. by this arrangement, the first side bin door 242 and the second side bin door 243 may actively pop out to support the main bin door 241 when the user lifts the main bin door 241 upwards.

Figure 29:
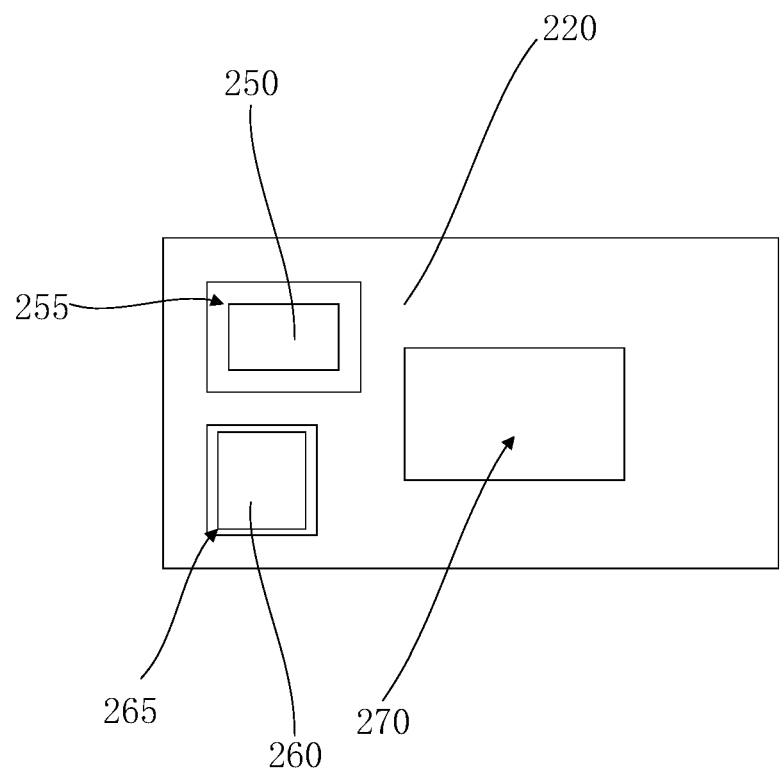
FIG. 29 is another schematic view of a detection terminal box according to an embodiment of the present disclosure.

Further referring to FIG. 29, as shown in FIG. 29, the detector further includes a controller 250 and a power supply 260.

Specifically, the controller 250 is configured to control the display 230 and the detector 10. The controller 250 is electrically connected to the display 230, the detector 10, etc. Specifically, the controller 250 is connected to the socket 513 (as shown in FIG. 3) of the cable winding frame 50 through a data cable, which is not limited therein.

In some embodiments, the controller 250 may be connected to other terminal setups via Wi-Fi, Bluetooth, mobile signal networks, etc. For example, the user can download a dedicated application and control the controller 250 through the application, which in turn controls the operation of the detection system 1.

Specifically, the power supply 260 is configured to provide power 260 to the display 230, the controller 250, and the detector 10, etc. The power supply 260 and the controller 250 are electrically connected. In some embodiments, the power supply 260 is a drawer-type rechargeable battery. In some embodiments, the capacity of the rechargeable battery is 4500 mAh, 10,000 MAH, etc. The present disclosure does not limit the capacity of the power supply 260. In some embodiments, the controller 250 may further include a utility interface to power the power supply 260 with utility power when the power supply 260 runs out of power.

Specifically, as shown in FIG. 29, the controller 250 and power supply 260 are arranged within the second portion 220 of the detection terminal box 20. For example, the detection terminal box 20 includes a controller bin 255 and a power supply bin 265, with the controller 250 arranged in the controller bin 255 and the power supply 260 arranged in the power supply bin 265.

In some embodiments, the second portion 220 of the detection terminal box 20 further includes a storage bin 270 for storing components such as the cable winding frame 50.

The above mentioned is only the implementation of the present disclosure, not to limit the scope of the present disclosure. Any equivalent structure or equivalent transformation made by using the content of the specification of the present disclosure and the attached drawings or applied directly or indirectly in other related technical fields, are included in the scope of the present disclosure in the same way.

What is claimed is:

1. A signal receiver, comprising:
    a housing, comprising:
        a body, comprising a first face and a second face disposed opposite each other; and
        a protrusion, connected to the body and protruding relative to the first face along an extending direction away from the second face;
    a handle, arranged on the first face and along the extending direction; wherein the handle comprises a first leg, a second leg, and a grip bar connected to both the first leg and the second leg;
    a gap is defined between the grip bar and the first face or a user to grip; and
    a speaker sound hole, arranged on the first face; wherein a projection of the handle on the first face is at least partially coincident with the speaker sound hole;
    wherein the protrusion comprises a third face and a fourth face disposed opposite each other;
    the third face is connected to the first face of the body and is inclined relative to the first face; the fourth face is connected to the second face of the body and is inclined relative to the second face;
    wherein the first face comprises a first side edge, and the third face comprises a second side edge; the first side edge and the second side edge define a first plane; an intersection exists between the handle and the first plane; the first face of the body is arranged with an operating element, and the operating element is not intersected with the first plane.

2. The signal receiver according to claim 1, wherein,
    the operating element is arranged on a side of the handle and disposed between the first leg and the second leg;
    the operating element is a signal receiver operating mode switch comprising at least a near-field mode switching position and a far-field mode switching position.

3. The signal receiver according to claim 1, wherein,
    the housing defines a recess, the recess being recessed inwardly relative to the second face and the fourth face and extending along a first direction; the first direction is from the body to the protrusion; the recess comprises an opening disposed at the protrusion;
    the signal receiver further comprises an antenna holder; at least a portion of the antenna holder is arranged in the recess; the antenna holder comprises a connection end exposed from the opening.

4. The signal receiver according to claim 3, further comprising:
    an antenna, connected to the connection end; and
    a signal strength indicator, arranged on the third face.

5. The signal receiver according to claim 4, wherein the antenna is a linear antenna removably connected to the connection end of the antenna holder at an end.

6. The signal receiver according to claim 3, wherein a projection of the connection end on a plane in which the second face is located is disposed within a projection of the protrusion on the plane in which the second face is located.

7. A detection system, comprising:
    a detector, configured to obtain detection data and emit a wireless signal;
    a signal receiver, configured to receive the wireless signal for positioning the detector and comprising:
        a housing, comprising:
            a body, comprising a first face and a second face disposed opposite each other; and
            a protrusion, connected to the body and protruding relative to the first face along a direction away from the second face;
        a handle, arranged on the first face; and
        a speaker sound hole, arranged on the first face; wherein a projection of the handle on the first face is at least partially coincident with the speaker sound hole;
    a detection terminal box, configured to process the detection data;
    a cable, configured to transmit the detection data; wherein an end of the cable is connected to the detector, and the other end of the cable is connected to the detection terminal box; and
    a display, configured to display the detection data;
    wherein the detection terminal box comprises a first portion and a second portion that are collapsible together; the display is embedded in the first portion.

8. The detection system according to claim 7, wherein the first portion comprises:
    a display compartment, in which the display is embedded;
    a main bin door, configured to enclose and expose the display; and
    a first side bin door and a second side bin door, configured to support the main bin door in condition of the main bin door exposing the display.

9. The detection system according to claim 7, wherein,
    the handle comprises a first leg, a second leg, and a grip bar connected to both the first leg and the second leg;
    a gap is defined between the grip bar and the first face or a user to grip.

10. The detection system according to claim 9, wherein the protrusion comprises a third face and a fourth face disposed opposite each other;
- the third face is connected to the first face of the body and is inclined relative to the first face;
- the fourth face is connected to the second face of the body and is inclined relative to the second face.

11. The detection system according to claim 10, wherein,
- the first face comprises a first side edge, and the third face comprises a second side edge; the first side edge and the second side edge define a first plane; an intersection exists between the handle and the first plane;
- the first face of the body is arranged with an operating element, and the operating element is not intersected with the first plane.

12. The detection system according to claim 11, wherein,
- the operating element is arranged on a side of the handle and disposed between the first leg and the second leg;
- the operating element is a signal receiver operating mode switch comprising at least a near-field mode switching position and a far-field mode switching position.

13. The detection system according to claim 10, wherein,
- the housing defines a recess, the recess being recessed inwardly relative to the second face and the fourth face and extending along a first direction; the first direction is from the body to the protrusion; the recess comprises an opening disposed at the protrusion;
- the signal receiver further comprises an antenna holder; at least a portion of the antenna holder is arranged in the recess; the antenna holder comprises a connection end exposed from the opening.

14. The detection system according to claim 13, wherein the signal receiver further comprises:
- an antenna, connected to the connection end; and
- a signal strength indicator, arranged on the third face.

15. The detection system according to claim 13, wherein a projection of the connection end on a plane in which the second face is located is disposed within a projection of the protrusion on the plane in which the second face is located.

* * * * *